United States Patent [19]

Reinholz

[11] Patent Number: 4,922,190
[45] Date of Patent: May 1, 1990

[54] ADAPTOR DEVICE FOR AN ARRANGEMENT FOR TESTING PRINTED-CIRCUIT BOARDS

[75] Inventor: Robby Reinholz, Berlin, Fed. Rep. of Germany

[73] Assignee: Siemens Aktiengesellschaft, Berlin & Munich, Fed. Rep. of Germany

[21] Appl. No.: 317,012

[22] Filed: Feb. 28, 1989

[30] Foreign Application Priority Data

Feb. 29, 1988 [DE] Fed. Rep. of Germany ....... 3806793

[51] Int. Cl.⁵ .............................................. G01R 1/06
[52] U.S. Cl. ............................ 324/158 F; 324/158 P
[58] Field of Search ........... 324/158 P, 158 F, 73 PC, 324/72.5; 439/45, 46

[56] References Cited

U.S. PATENT DOCUMENTS 4,833,402 5/1989 Boegh-Petersen .............. 324/158 F

FOREIGN PATENT DOCUMENTS 0142119 5/1985 European Pat. Off. .
530039 12/1921 France .
8505229 11/1985 World Int. Prop. O. .

Primary Examiner—Reinhard J. Eisenzopf
Assistant Examiner—Edward Urban
Attorney, Agent, or Firm—Kenyon & Kenyon

[57] ABSTRACT

An adaptor device for an arrangement for testing printed-circuit boards. The adaptor device comprises at least two printed-circuit boards arranged side-by-side and at a right angle to the surface of the test printed-circuit board. On an input side, the adaptor device has contacts, which are connected, by means of circuit-board conductors, with contact elements on an output side, lying opposite the incoming side. The adaptor device comprises basic adaptor elements of printed-circuit boards, assembled in pairs, with one row each of contacts, directed toward the test printed-circuit board, which extend up to contact surfaces of first plated through-holes. Below two consecutive through-holes, an additional through-hole with back-to-back insulated contact surfaces is arranged, which contact surfaces are connected by circuit-board conductors with the respective contact surfaces of the first though-holes. The contact elements extend from the outside up to the contact surfaces. The adaptor device can be individually assembled from the basic adaptor elements, according to the arrangement of monitoring points on each of the test printed-circuit boards.

8 Claims, 5 Drawing Sheets

ADAPTOR DEVICE FOR AN ARRANGEMENT FOR TESTING PRINTED-CIRCUIT BOARDS

BACKGROUND OF THE INVENTION

The present invention relates to an adaptor device for an arrangement for testing printed-circuit boards having an electric contact panel connected to an evaluator. The test printed-circuit board can be connected by means of the adaptor device to the contact panel, whereby the adaptor device comprises several printed-circuit boards, lying side-by-side and at a right angle to the surface of the test printed-circuit board and has contacts on its incoming side turned toward the test printed circuit board. The contacts are connected by means of circuit-board conductors to the contact elements, which are turned towards the contact panel on the output end of the adaptor device, opposite the incoming side.

In a well-known adaptor device of this type (EP 0 142 119 B1), the printed-circuit boards, which constitute the adaptor device, are provided with contact surfaces on their incoming side, turned toward the test printed-circuit board, as well as on the opposite output end, which are connected to each other by means of circuit-board conductors. Thereby, the contacts to the contact surfaces, which constitute the test printed circuit board, are situated on the incoming side of the printed-circuit boards, for example, spaced apart at a distance corresponding to half the normal contact spacing, while the contact elements to the contact surfaces, which constitute the electric contact panel, are arranged on the output end of the printed-circuit boards, spaced apart at a distance corresponding to the normal contact spacing. The printed-circuit boards of the known adaptor device represent, therefore, reducing boards. By arranging two sets of printed-circuit boards at a time in an intersecting topology, a printed-circuit board with monitoring points in half contact spacing, which will be tested, can be connected to the electric contact panel with standard contact spacing, so that such printed-circuit boards can also be tested using an arrangement with a contact panel with standard contact spacing.

SUMMARY OF THE INVENTION

According to the invention, in the case of an adaptor device of the type discussed above, the adaptor device contains basic adaptor elements made of printed circuit boards, assembled in pairs. Each basic adaptor element supports a single row of the contacts and features a first plated through-hole below each contact. Also, the contacts extend to a contact surface of the first plated through-hole. Below two consecutive first through-holes, an additional through-hole with back-to-back insulated contact surfaces is arranged in the printed circuit boards of the basic adaptor element, and on the printed-circuit boards, both contact surfaces of the additional through-hole are connected, by means of the circuit-board conductors to the contact surfaces of two consecutive first through-holes. The contact elements extend to the contact surfaces of the additional through-holes.

An important advantage of the adaptor device, according to the invention, lies in the fact that the adaptor device has a modular-type construction of basic adaptor elements made of printed-circuit boards assembled in pairs, so that an adaptor device can be assembled from the basic adaptor elements, according to the arrangement of monitoring points on the test printed-circuit board. The basic adaptor elements can be advantageously manufactured from "material sold by the meter", which consists of two printed-circuit boards assembled with plated contact surfaces in the area of one of the through-holes and additional plated contact surfaces in the area of the other through-holes, separated by an insulating layer. By removing appropriate long sections from such an intermediate product, basic adaptor elements can then be configured with, accordingly, many contacts on the incoming side or contact elements on the output end. Thus, the production of basic adaptor elements and, consequently, the adaptor device, is considerably simplified according to the invention.

Thereby, it is possible to connect monitoring points, situated outside of the standard contact spacing on the test printed-circuit board, to the electric contact panel in the standard contact spacing, by arranging several basic adaptor elements side-by-side and, accordingly, laterally displacing the contacts on the incoming side diagonally to the longitudinal extension of the incoming side.

It is especially expedient that, according to the invention, the adaptor device for testing printed-circuit boards with monitoring points can be applied, in accordance with integrated modules, which have soldering points in parallel rows on the bottom side of the modules, according to the SO standard for SMD components (internationally standardized according to JEDEC MS - 013 - AD, Edition A, Jun. 1985). The monitoring points lie then, accordingly, on the test printed-circuit board. To test such printed-circuit boards, two basic adaptor elements are installed next to each other, and the spacings between their rows of contacts on the incoming side are selected in a way, so that the rows of contacts lie apart from the rows of monitoring points on the test printed-circuit board. It is possible to shift the position of the contacts on the incoming side in the direction of the through-holes or parallel to this, because one of the through-holes features a contact surface over its entire length, so that the contacts, extending from the incoming side up to one of the through-holes, can be brought into contact with the contact surface of this one through-hole, over the entire width of the incoming side of each basic adaptor element.

In the case of the adaptor device, according to the invention, the contacts can be designed in a different way. However, it is regarded as advantageous in view of a comparatively simple production of the adaptor device, if the contacts are connector pins arranged in blind holes, which are introduced from the incoming side of the basic adaptor element up to the through-holes.

The contact elements on the output side of the adaptor device or the basic adaptor elements are advantageously rigid or flexible contact needles, which pass through blind holes, introduced in each printed-circuit board from the output side of the basic adaptor element up to the other through-holes.

In the case of the adaptor device, according to the invention, the contact elements lie side-by-side in the curve of the output end of the adaptor device in the standard contact spacing. Also, as a result of the other through-holes, spaced apart, accordingly, the contact elements lie in the same contact spacing, one behind the other, on the output end of the basic adaptor element.

Thus, this basic adaptor element fits directly into the configuration of the contact members, in the electric contact panel.

With regard to the position of the monitoring points of the test printed-circuit board, the contacts can be arranged differently on the incoming side of the basic adaptor element. An especially preferred embodiment is arranging the contacts at an interval corresponding to half of the standard contact spacing, on the incoming side of the basic adaptor element, because this type of basic element enables the testing of printed-circuit boards with monitoring points for most internationally standardized, integrated SMD modules.

To configure the adaptor device, according to the invention, the basic adaptor elements can be assembled in a different way. As already mentioned above, a side-by-side arrangement of the basic adaptor elements is expedient. Another preferred embodiment is assembling the basic adaptor elements in the configuration of a frame. The configuration of this type of frame, made of basic adaptor elements, is advantageous, if the test printed-circuit boards feature monitoring points corresponding to integrated modules with soldered connection points, according to the PLCC Standard (International Standard JEDEC MO -047 - AA, Edition A, 1984), or arranged similarly. In these types of integrated modules, the soldered connections are arranged in rows in a square.

In the testing of printed-circuit boards, it occurs only in rare cases and, to an extent, only purely by chance, that the position of the test printed-circuit board corresponds to the adaptor device, so that the contacts of the adaptor device touch on all the monitoring points on the test printed-circuit board. It is rather likely that the adaptor device will have to be aligned to the test printed-circuit board before testing. In a further development of the invention, this is facilitated by increasing by one the number of contacts and contact elements of the basic adaptor element, measured by the number of each of the test points arranged in rows on the test printed-circuit board. If, for example, one assumes the case that the monitoring points in the row have an interval between them of 1/20" on the test printed-circuit board and that the contact members are arranged in 1/10" contact spacing on the electric contact panel, then a possible displacement of the adaptor device relative to the test printed-circuit board is limited to the extent that, with a displacement of 1/20", the contact elements will coincide with spaces in the contact panel. By applying a surplus contact, as well as a contact element, it is assured, that in the case of a displacement in the magnitude of 1/20", the additional contact and the additional contact element will be effective.

Another way to align an adaptor device with a frame configuration to the test printed-circuit board lies in displacing the contacts, in at least one direction, by ¼ of the normal contact spacing of the electric contact panel, in comparison with a centrosymmetrical arrangement, relative to a longitudinal axis through the frame.

BRIEF DESCRIPTION OF THE DRAWINGS

The invention will be described in greater detail in the following detailed description with reference to the drawings, in which.

DETAILED DESCRIPTION

Figure 1:
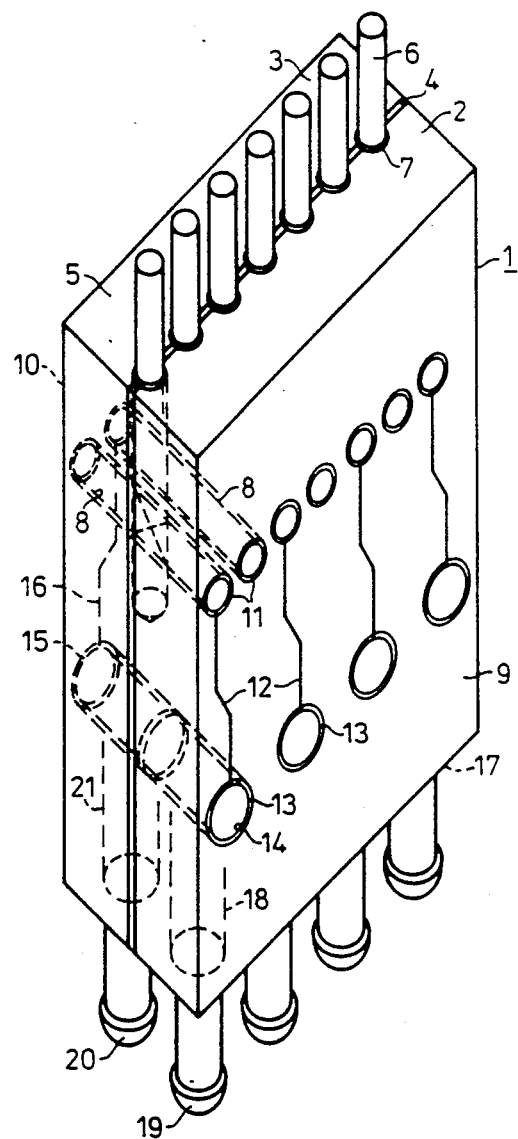
FIG. 1 is a perspective representation of an exemplary embodiment of a basic adaptor element of the adaptor device according to the invention.

The basic adaptor element 1, depicted in FIG. 1, comprises a printed-circuit board 2 and an additional printed-circuit board 3. The printed-circuit boards 2 and 3 are assembled together, separated by an insulating layer 4. The basic adaptor element 1, configured in this manner, is provided with contacts 6 on its incoming side 5, which are introduced in blind holes 7. The contacts 8 consist of connector pins. The blind holes 7, which receive the connector pins, lead up to through-holes 8, in the basic adaptor element 1. These through-holes 8 run diagonally to the row of contacts 6 and are each placed, so that a through-hole 8 is situated below a contact 6. All of the through-holes 8 are plated-through, which, for example, can result from the fact that metal bushings, extending from the front end 9 of the basic adaptor element 1 to the rear 10, are inserted as contact surfaces 11 in the through-holes 8. The contact surfaces 11 of the through-holes 8 are electrically connected to the contacts 6, in that the latter extend in, up to the contact surfaces 11. In the basic adaptor element 1, therefore, each contact 6 is connected to the contact surface 11 in a through-hole 8.

On the front end 9 of the basic adaptor element 1, circuit-board conductors 12 run from the contact surfaces 11 of the through-holes 8 to contact surface 13 of other through-holes 14 in the basic adaptor element 1. These contact surfaces 13 are each provided for in the area of the printed-circuit board 2. In the area of the printed-circuit board 3, a contact surface 15 is present in another through-hole 14. The contact surfaces 13 and 15 are electrically insulated from each other by the insulation layer 4.

The additional through-holes 14 of the basic adaptor element 1 are arranged so that an additional through-hole lies below two consecutive through-holes 8. Thus, the contact surface 11 of the through-hole 8, to the far left in FIG. 1, can be connected by means of the circuit-board conductor 12 with the contact surface 13 of the additional through-hole 14, situated to the far left, and the through-hole 8, which follows next in FIG. 1, can be connected by means of an additional circuit-board conductor 16 on the printed-circuit board 3, with the contact surface 15. Accordingly, two more consecutive through-holes 8 are connected by means of their contact surface 11 with contact surfaces 13 or 15 in additional through-holes 14.

In the case at hand, it is assumed that the contacts 6 follow each other in an interval, which corresponds to half of the standard contact spacing of monitoring points on a test printed-circuit board, i.e., 1/20". Furthermore, it is assumed that a connection is to be established with the basic adaptor element 1, on its output end 17, with an electric contact panel, not shown in FIG. 1, and the contacts of the electric contact panel are arranged, spaced apart in the standard contact spacing of 1/10". Accordingly, in the depicted exemplified embodiment, the additional through-holes 14 are found spaced apart at a distance of 1/10", and contact elements 19, which extend up to the contact surface 13 of the additional through-hole 14, are provided in boreholes 18, which are introduced from the output end 17. Therefore, the contact elements 19 lie, one behind the other, on the output end 17 of the basic adaptor element 1, at an interval corresponding to the standard contact spacing.

The contact elements 20 are arranged in the printed-circuit board 3 of the basic adaptor element 1, according to the contact elements 19, whereby the contact elements 20 are inserted in bore holes 21, which extend up to the contact surface 15. The bore holes 18 and 21 have, thereby, a clearance which corresponds to the normal contact spacing. This means that, in the case of the basic adaptor element 1 shown in FIG. 1, contacts 6 and, therewith, monitoring points connected to these contacts on a printed-circuit board with contact members, not depicted here, can be electrically connected with contact members in an electric contact panel, which is present below the basic adaptor element, not shown here, on which the contact members are arranged in normal contact spacing.

The production of the basic adaptor element 1 depicted in FIG. 1 is relatively simple, because the block from the printed-circuit boards 2 and 3 with the insulation layer 4 is cut out of a pre-fabricated larger printed-circuit board unit, so that the block is separated out of supplied material sold by the meter.

Figure 2:
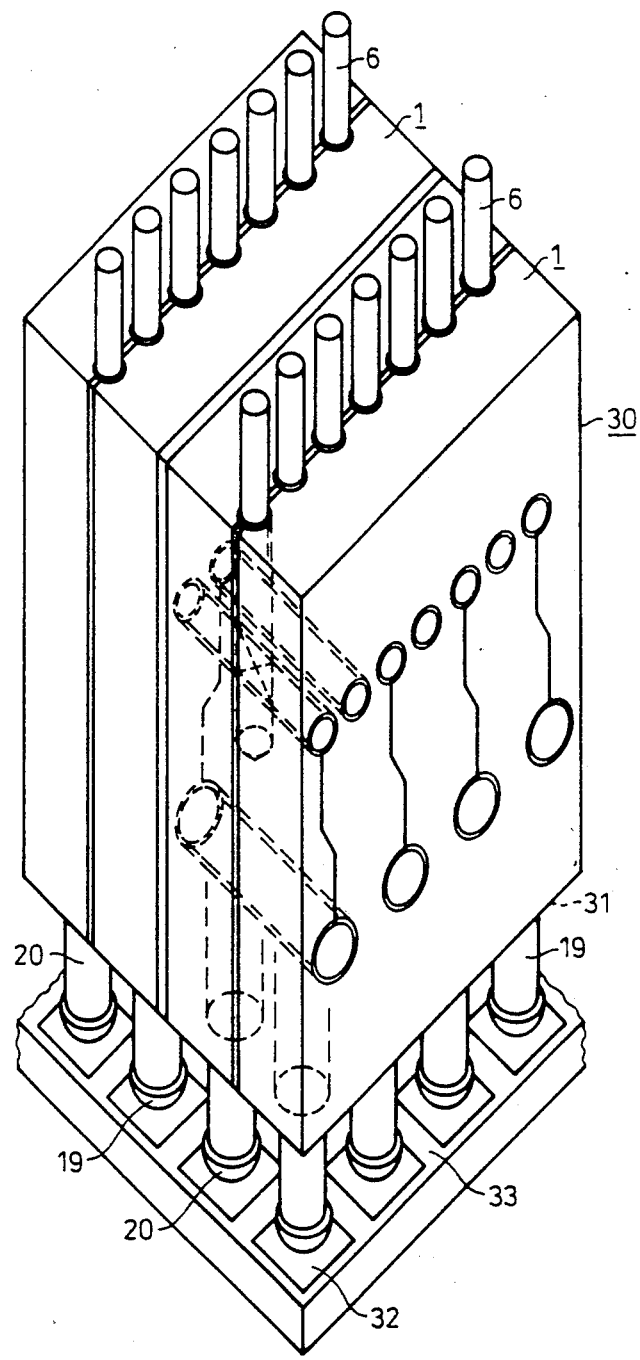
FIG. 2 shows an exemplary embodiment of an adaptor device with two basic adaptor elements, arranged side-by-side.

In FIG. 2, an adaptor device 30 made of two basic elements 1 is depicted, as they were described in detail, based on FIG. 1. The adaptor device 30 is, thereby, designed with a basic adaptor element 1, according to FIG. 1, the back end 10 of which is connected, for example, bonded, to the front end 9 of another basic element 1. The two basic adaptor elements 1 are connected in a way that results in the contact elements 19 or 20 being arranged on the output end 31 of the adaptor device 30, so that they are spaced apart in the standard contact spacing. In this case, the contact elements 19 or 20 rest in the middle on contact members 32 of an electric contact panel 33, which is connected over lines with an electric evaluator, not depicted here. Above the illustrated adaptor device 30 its contacts 6 are connected to an arrangement of monitoring points in the SO Standard on a test printed-circuit board, also not depicted.

Figure 3:
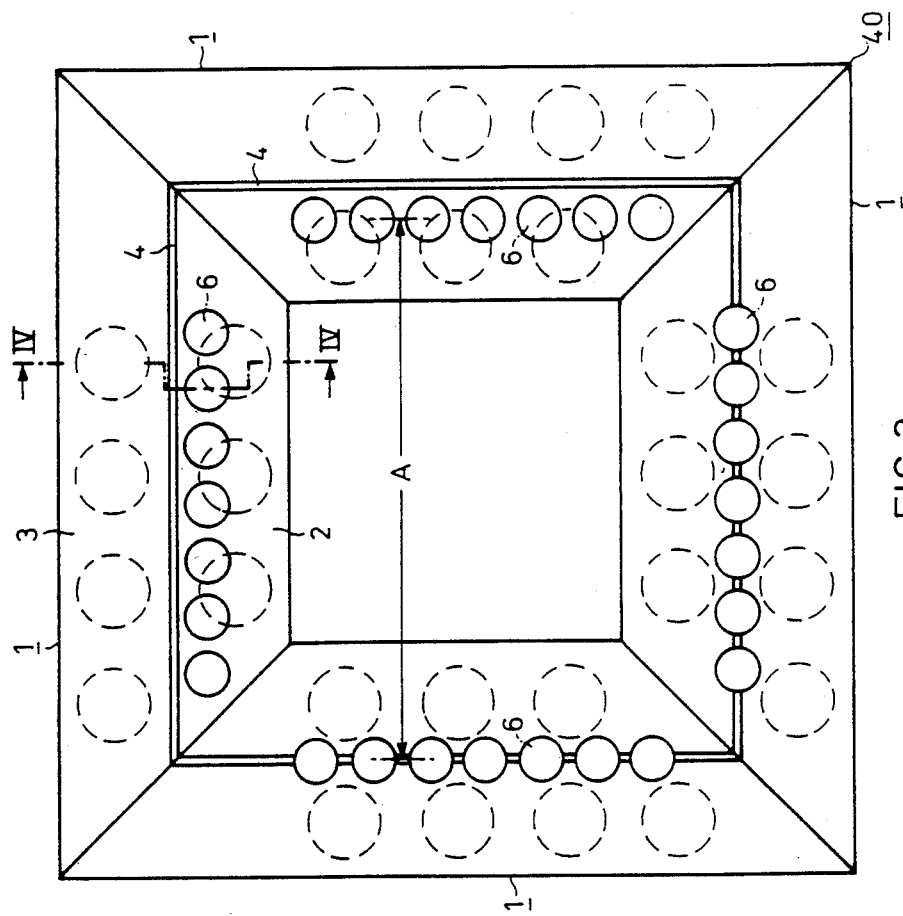
FIG. 3 is a top view of a further exemplary embodiment of the adaptor device, according to the invention, with basic adaptor elements, configured as a frame.

In the exemplified embodiment of FIG. 3, four basic adaptor elements 1 are assembled to form a frame, where each of their ends are miter-cut and bonded to each other. Consequently, an adaptor device 40 is then provided, which is suited for testing printed-circuit boards with rows of monitoring points arranged in a square. This type of arrangement of monitoring points results, if integrated modules with soldered connections are to be applied on the test printed-circuit board, according to the PLCC Standard. In the example presented, it is assumed that there are 7 monitoring points in a square on the test printed-circuit board, which is not illustrated, which is why the adaptor device 40 is provided with seven contacts 6, relating to each basic adaptor element 1.

Furthermore, it is assumed that opposite monitoring points on the test printed-circuit board are not spaced apart opposite each other in the normal contact spacing. To obtain a clearance between the rows of contacts 6, lying opposite each other, which corresponds to the clearance A between monitoring points, lying opposite each other, in the basic adaptor element 1, shown to the right in FIG. 3, the contacts 6, from the plane of the interlayer insulation 4, are inserted, shifted to the left. This can be easily implemented in the basic adaptor element 1, since—as FIG. 1 especially illustrates—a contact closure between the contact 6 and the plated contact surface 11 of the through-hole 8 is rendered possible by a displacement of the contacts 6 along the through-hole 8. The position of the contact elements 19 or 20 on the output end of the adaptor device 40 is, thereby, not affected. Accordingly, in the case of the exemplified embodiment of FIG. 3, the contacts 6 in the upper basic adaptor element are appropriately shifted downward, out of the plane of the interlayer insulation 4, so that, consequently, the rows of contacts 6 in the upper and in the lower basic adaptor element 1 will also be spaced apart with the clearance A.

Figure 4:
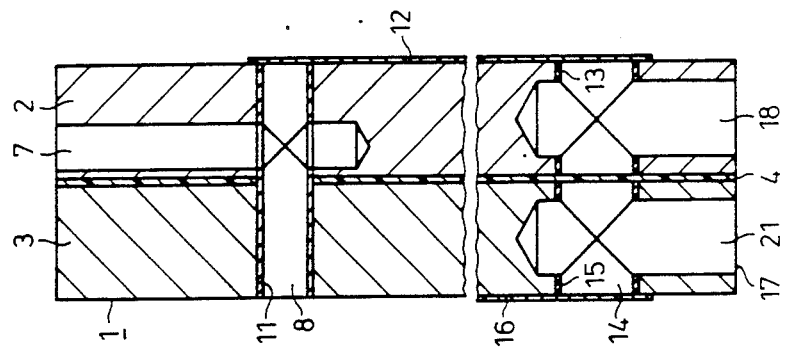
FIG. 4 is a section along the line IV—IV of FIG. 3.

The section along line IV—IV of FIG. 3, represented in FIG. 4, clearly illustrates the displacement of the blind holes 7 in the printed-circuit board 2 of the upper basic adaptor element 1, according to FIG. 3. Furthermore, in FIG. 4, the contact surface 11 in the through-hole 8 of the depicted basic adaptor element 1 is clearly recognizable. If applicable, this contact surface can also be achieved with a metallizing. The contact 6 is not depicted in FIG. 4; it extends up to the area of the contact surface 11, which results in an electrical connection of the contact 6 and contact surface 11. It can be clearly recognized in the lower part of FIG. 4, that the contact surfaces 13 and 15 of the additional through-hole 14 are arranged so that they are insulated from each other by the interlayer insulation 4. Furthermore, the blind holes 18 and 21 can be recognized, which extend over the contact surfaces 13 and 15 into the printed circuit-boards 2 or 3, so that contact elements, introduced on the bottom 17, make electrical contact with the contact surfaces 13 and 15. The contact surface 13 is electrically connected to the contact surface 11 through the circuit-board conductor 12. The circuit-board conductor 16, on the left side of the basic adaptor element in FIG. 4, leads to the contact surface 11 of a through-hole 8, which lies, in the drawing plane, behind the depicted through-hole 8.

The testing of printed-circuit boards with monitoring points in half contact spacing succeeds easily with the adaptor device, according to the invention, if an alignment to the test printed-circuit board is obtained by shifting the adaptor device, in both directions, up to half of the contact spacing on the electric contact panel. A displacement by exactly half of the contact spacing causes difficulties, however, because in this case assuming an alignment, where the contact elements lie exactly in the middle of the contact members of the electric contact panel, the contact elements hit upon insulation gaps in the electric contact panel. In order to enable a testing in every case with an appropriate alignment of the adaptor device of the test printed-circuit board, each basic adaptor element 50 is provided, according to the exemplified embodiment of FIG. 5, with an additional contact in the row of contacts 6 on the incoming side and an additional contact element on the output end. Therefore, each basic adaptor element 50 has, in addition to the seven contacts 6, provision for seven soldered connection points on the test printed-circuit board, in the case as represented an additional eighth contact and also eight contact elements 19 and 20. As FIG. 5 also shows, the contacts 6 are all shifted inward out of the area of the interlayer insulation 4 by a segment, which is required to adapt to the spacing between opposite rows of monitoring points on the test printed-circuit board.

Figure 5:
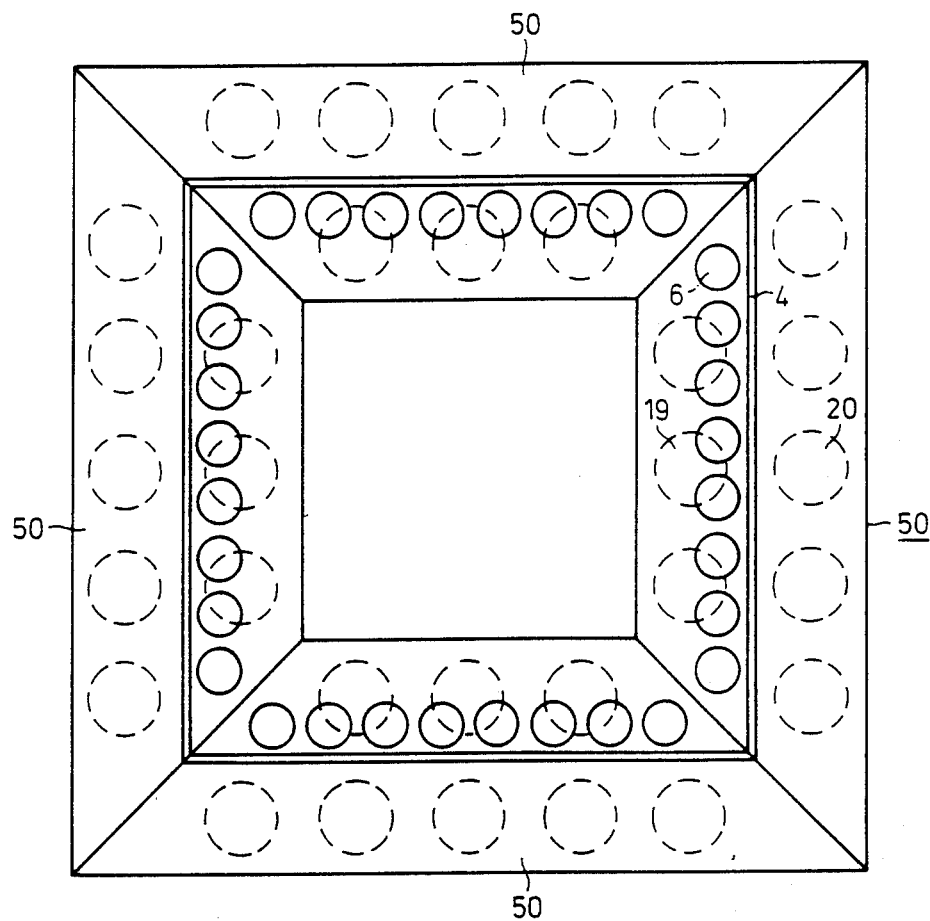
FIG. 5 is another top view of a further exemplary embodiment of the adaptor device, according to the invention, with basic adaptor elements, configured as a frame, with an additional contact and an additional contact element.
Figures 6A, 6B:
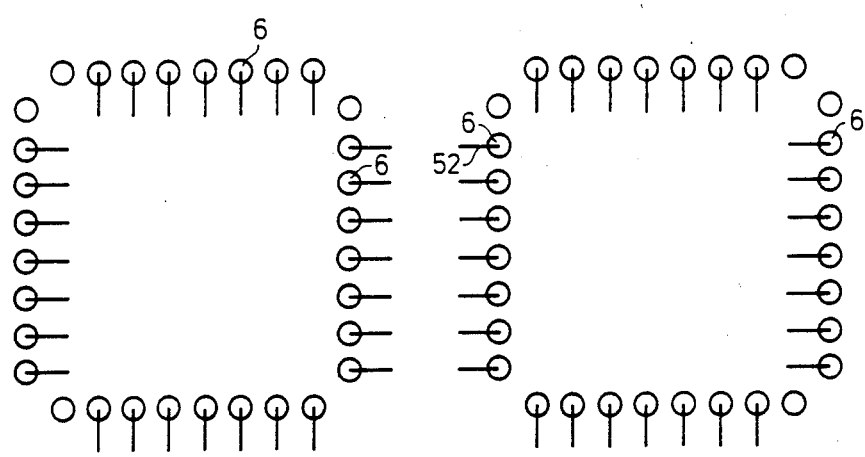
FIG. 6 is a representation illustrating possibilities for aligning an adaptor device of FIG. 5, with regard to a test printed-circuit board.
Figure 6C:
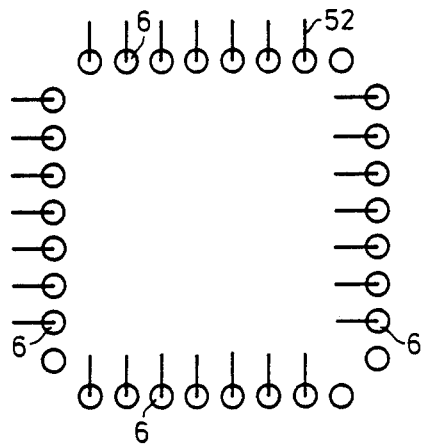

The arrangement of contacts 6 or contact elements 19 and 20, shown in FIG. 5, enables an alignment of the adaptor device relative to the test printed-circuit board to an extent, which is illustrated in FIG. 6. Thereby, the representation A of FIG. 6 depicts the contacts 6 of an adaptor device, according to FIG. 5, which by the way is not further illustrated, in a position aligned to the soldered connections 52 of a test printed-circuit board, also not depicted, whereby the soldered connections are arranged according to the PLCC Standard. Hereby, the contact 6 of the horizontally depicted contact rows, lying to the left, and each upper contact 6 of the vertically depicted contact rows are unused. In the representation B of FIG. 6, it is assumed that the position of the soldered connections to be tested on the test printed-circuit board is displaced 1/20" to the left relative to the electric contact panel. In this case, in representation A, the left contact of the upper row and of the lower row of contacts 6 of the adaptor device are used to make contact with the soldered connections, and the right contact of the upper and lower row remains free of contacts. The left row of contacts 6 of the adaptor device in representation B is still in contact with the soldered connections 52 on the test printed-circuit board, because these connections have a relatively sizable length. The same applies to the contacts 6 of the right contact row in representation B. This shows that, also when the arrangement of monitoring points on a test printed-circuit board is displaced by 1/20" to the left, relative to the electric contact panel with the standard contact spacing of 1/10", a connection of the soldered connections 52 of the test printed-circuit board with the electric contact panel is still possible through the adaptor device according to the invention.

According to representation C of FIG. 6, it is assumed that the test printed-circuit board with its soldered connections 52 is displaced in the other direction relative to the electric contact panel by half (1/20") of the standard contact spacing. Nothing changes, then, in the upper and lower row of the contacts 6, as far as contact closure with the soldered connections of the test printed-circuit board is concerned; however, the situation is different in the left or right row of contacts 6 because these contacts change their position relative to the soldered connections 52 on the test printed-circuit board, in that now the lower contact 6 in the representation C becomes free, and the upper contact makes contact with the soldered connection 52 of the test printed-circuit board.

A simple method is thus created to align the adaptor device, according to the invention, to the test printed-circuit board.

In the foregoing specification, the invention has been described with reference to specific exemplary embodiments thereof. It will, however, be evident that various modifications and changes may be made thereunto without departing from the boarder spirit and scope of the invention as set forth in the appended claims. The specification and drawings are, accordingly, to be regarded in an illustrative rather than in a restrictive sense.

What is claimed is:

1. An adaptor device for an arrangement for testing printed-circuit boards having an electric contact panel connected to an evaluator arrangement whereby a test printed circuit board can be connected by the adaptor device to said contact panel, the adaptor device comprising at least two printed-circuit boards, lying side-by-side and at a right angle to the surface of the test printed-circuit board and having input side contacts arranged in rows on an input side directed toward the test printed-circuit board, said input side contacts being connected by circuit-board conductors to output side contact elements directed toward the contact panel on an output side of the adaptor device, opposite the input side, the two printed circuit boards comprising basic adaptor elements, each basic adaptor element supporting a single row of the input side contacts and having a first plated through-hole disposed below each input side contact, the input side contacts extending to a contact surface of said first through-hole, further comprising an additional through-hole having back-to-back insulated contact surfaces arranged below two consecutive through-holes, respective contact surfaces of the additional through-hole being connected to the respective contact surfaces of two consecutive first through-holes in the area of both printed-circuit boards, the output side contact elements extending to the contact surfaces of the additional through-holes.

2. The adaptor device recited in claim 1, wherein the input side contacts are connector pins arranged in blind holes, which are introduced from the input side of the basic adaptor element to the first through-holes.

3. The adaptor device recited in claim 1, wherein the output side contact elements are contact needles which pass through blind holes, introduced in each printed-circuit board from the output side of the basic adaptor element to the additional through-holes.

4. The adaptor device recited in claim 1, wherein the output side contact elements lie adjacently at the output side of the adaptor device in a standard contact spacing and, as a result of the additional through-holes are spaced apart accordingly in the same contact spacing, one behind the other, on the output side of the basic adaptor element.

5. The adaptor device recited in claim 1, wherein the input side contacts lie at an interval corresponding to half of a standard contact spacing on the input side of the basic adaptor element.

6. The adaptor device recited in claim 5, wherein the basic adaptor elements are assembled in the configuration of a frame.

7. The adaptor device recited in claim 1, wherein the number of input side contacts and output side contact elements of the basic adaptor element, measured by the number of each of the test points arranged in rows on the test printed-circuit board, is increased by one.

8. The adaptor device recited in claim 6, wherein the input side contacts are displaced in at least one direction, by one fourth of a standard contact spacing, in comparison with a centrosymmetrical arrangement, relative to a longitudinal axis through the frame.

* * * * *